US009866017B2

(12) United States Patent
Kanemaru et al.

(10) Patent No.: US 9,866,017 B2
(45) Date of Patent: Jan. 9, 2018

(54) DC POWER GENERATION SYSTEM AND PROTECTION METHOD FOR DC POWER GENERATION SYSTEM

(71) Applicant: Mitsubishi Electric Corporation, Chiyoda-ku (JP)

(72) Inventors: Makoto Kanemaru, Chiyoda-ku (JP); Takeshi Shindoi, Chiyoda-ku (JP); Tomotaka Yano, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 213 days.

(21) Appl. No.: 14/911,238

(22) PCT Filed: Jan. 17, 2014

(86) PCT No.: PCT/JP2014/050748
§ 371 (c)(1),
(2) Date: Feb. 9, 2016

(87) PCT Pub. No.: WO2015/029458
PCT Pub. Date: Mar. 5, 2015

(65) Prior Publication Data
US 2016/0181799 A1   Jun. 23, 2016

(30) Foreign Application Priority Data

Aug. 26, 2013   (JP) .................... 2013-174105

(51) Int. Cl.
*H02J 1/00*   (2006.01)
*H02S 50/00*   (2014.01)
(Continued)

(52) U.S. Cl.
CPC .............. *H02J 1/00* (2013.01); *H02H 1/0015* (2013.01); *H02H 3/38* (2013.01); *H02H 7/20* (2013.01);
(Continued)

(58) Field of Classification Search
CPC combination set(s) only.
See application file for complete search history.

(56) References Cited

U.S. PATENT DOCUMENTS 8,179,147 B2 *   5/2012   Dargatz ............... H02H 1/0015
324/536
8,218,274 B2 *   7/2012   Hastings ........... H01L 31/02021
361/42

(Continued)

FOREIGN PATENT DOCUMENTS

GB   2485527 A   5/2012
JP   2011-091995 A   5/2011

(Continued)

OTHER PUBLICATIONS

Extended European Search Report dated May 8, 2017 in Patent Application No. 14840613.5.
International Search Report dated Apr. 8, 2014, in PCT/JP2014/050748 Filed Jan. 17, 2014.

*Primary Examiner* — An Luu
(74) *Attorney, Agent, or Firm* — Oblon, McClelland, Maier & Neustadt, L.L.P.

(57) ABSTRACT

A DC power generation system in which an arc detector, comprising an arc noise analysis unit which detects an arc which occurs in a DC power generation system based on noise of signal of a voltage-current sensor, a voltage-current variation analysis unit for specifying an arc occurrence point in a case where an arc is detected in the arc noise analysis unit, a voltage-current operation point of output of each string is analyzed based on a signal from a voltage-current sensor and based on variation of voltage-current operation point before and after when an arc is detected and a switch control unit for controlling of opening or closing of a switch based on an arc specified result in a voltage-current variation analysis unit, is provided.

13 Claims, 21 Drawing Sheets

(51) Int. Cl.
*H02H 1/00* (2006.01)
*H02H 3/38* (2006.01)
*H02H 7/20* (2006.01)
*H02M 7/44* (2006.01)
*G01R 31/02* (2006.01)
*G01R 31/12* (2006.01)
*H02H 7/26* (2006.01)
*G01R 31/08* (2006.01)

(52) U.S. Cl.
CPC .............. *H02M 7/44* (2013.01); *H02S 50/00* (2013.01); *G01R 31/025* (2013.01); *G01R 31/08* (2013.01); *G01R 31/1227* (2013.01); *H02H 7/268* (2013.01); *Y02E 10/56* (2013.01)

(56) References Cited

U.S. PATENT DOCUMENTS

| | | | |
|---|---|---|---|
| 9,768,605 B2 * | 9/2017 | Kolker | ........... H02H 1/0015 |
| 2004/0027749 A1 | 2/2004 | Zuercher et al. | |
| 2011/0090607 A1 | 4/2011 | Luebke et al. | |
| 2012/0112760 A1 | 5/2012 | Yoscovich et al. | |
| 2012/0134058 A1 | 5/2012 | Pamer et al. | |

FOREIGN PATENT DOCUMENTS

| | | |
|---|---|---|
| JP | 2012-112937 A | 6/2012 |
| WO | 2002/039561 A2 | 5/2002 |

* cited by examiner

DC POWER GENERATION SYSTEM AND PROTECTION METHOD FOR DC POWER GENERATION SYSTEM

TECHNICAL FIELD

This invention relates to detection of a parallel arc or a series arc in a DC power generation system, and protection against occurrence of an arc.

BACKGROUND ART

Due to the widespread of renewable energies, construction of mega solar systems are accelerated. In a case of a mega solar system of 1 MW volume, approximately 5000 pieces of panels are required. Consequently, a vast extent of land is covered with panels. Solar power generation systems are DC power supply, and at present, generally, they are low voltage lower than 750V, however, in future, their voltage might reach 1000 V. Further, due to degradation of cable, salt damage, etc., inferior electrification or contact resistance might increase, therefore, the probability of DC arc failure (series arc, parallel arc) might increase. In a case where the above-mentioned failure occurs, it is difficult to specify fault points in huge systems such as a mega solar system. Further, a current, which flows when a series arc or a parallel arc occurs, will not reach a current which trips a breaker. Consequently, it is necessary to establish protection method of solar power generation systems so as to prevent from continuing an arc in a case where an arc occurs.

Arc fault detection and protection of solar power generation system is disclosed in Patent Documents 1 to 3, for example. According to the Patent Document 1, a difference between power which is supplied to a load and power which is generated by photovoltaic panels is obtained, and in a case where a difference of the power is larger than a threshold value, an alarm condition is set. Alternatively, noise voltage of a load and noise voltage of photovoltaic panels are measured and a difference of the voltage is obtained, and in a case where a difference of the noise voltages is larger than a threshold value, an alarm condition is set. In a case where a difference between power which is generated by photovoltaic panels and power of a load is larger than a threshold value, an alarm condition is set. However, in a large-scale plant of a solar power generation system such as a mega solar system, power loss due to loss of back flow preventing diode or distribution cable and deterioration of a cable occurs. Consequently, it is difficult to judge occurrence of an arc only by power difference.

According to the Patent Document 2, an arc detector is provided at an end part of a power line and on a retrace line, and an overcurrent protection, an arc failure protection and a reverse-current protection can be performed. However, an arc detection is performed only by parallel arc judgement with a reverse-current detector.

According to the Patent Document 3, arc detection is performed based on variation of voltage-current, however, a case in which a constant voltage source is used is supposed. A voltage-current characteristic of a solar power generation system is different from that of a constant voltage source, therefore, judgement method is different. Further, judgement of an arc occurrence point or an arc mode is not performed, therefore, an arc failure point cannot be specified. Further, a case of plural parallel arcs is not supposed, and selective breaking technique is not included.

PRIOR ART REFERENCE

Patent Document

[Patent Document 1]
Japanese Patent Application Laid-Open No. 2012-112937
[Patent Document 2]
Japanese Patent Application Laid-Open No. 2011-91995
[Patent Document 3]
International publication WO2002/039561

DISCLOSURE OF THE INVENTION

Problems to be Solved by the Invention

A mega solar system as a DC power generation system is a huge system, therefore, in a case where an arc fault occurs, it is difficult to specify a point where an arc failure occurs. Further, a short circuit current is determined by a voltage-current characteristic of a solar panel. Therefore, even when an arc fault occurs, a switch does not operate. Consequently, it is necessary to separate only a fault section and realize to continue operation in a sound section.

In order to solve the above-mentioned problem, this invention is made, and this invention aims to provide a DC power generation system whose protection performance against occurrence of an arc is improved by judging an arc occurrence point and an arc mode.

Means for Solving the Problems

In a DC generation power system in which a plurality of strings, comprising a plurality of DC power generation modules, are connected in series and are connected to a DC bus in parallel, and power is supplied to the DC bus, each string has a voltage-current sensor which detects an output voltage and an output current of the string and a switch which intercepts connecting to the DC bus of the string at an output side; and has an arc detector comprising an arc noise analysis unit which detects an arc which occurs in the DC power generation system based on noise of a signal of the voltage-current sensor, a voltage-current variation analysis unit in which in a case where an arc is detected in the arc noise analysis unit, a voltage-current operation point of output of each string is analyzed based on a signal from the voltage-current sensor, and an occurrence point of the arc is specified based on variation of the voltage-current operation point before and after when the arc is detected, and a switch control unit which controls to open or close the switch based on an arc specified result in the voltage-current variation analysis unit.

Advantage of the Invention

According to this invention, regarding an arc fault which occurs in a DC power generation system, an arc occurrence point and an arc mode can be specified and only arc fault section can be separated.

EMBODIMENTS FOR CARRYING OUT THE INVENTION

Embodiment 1

Figure 1:
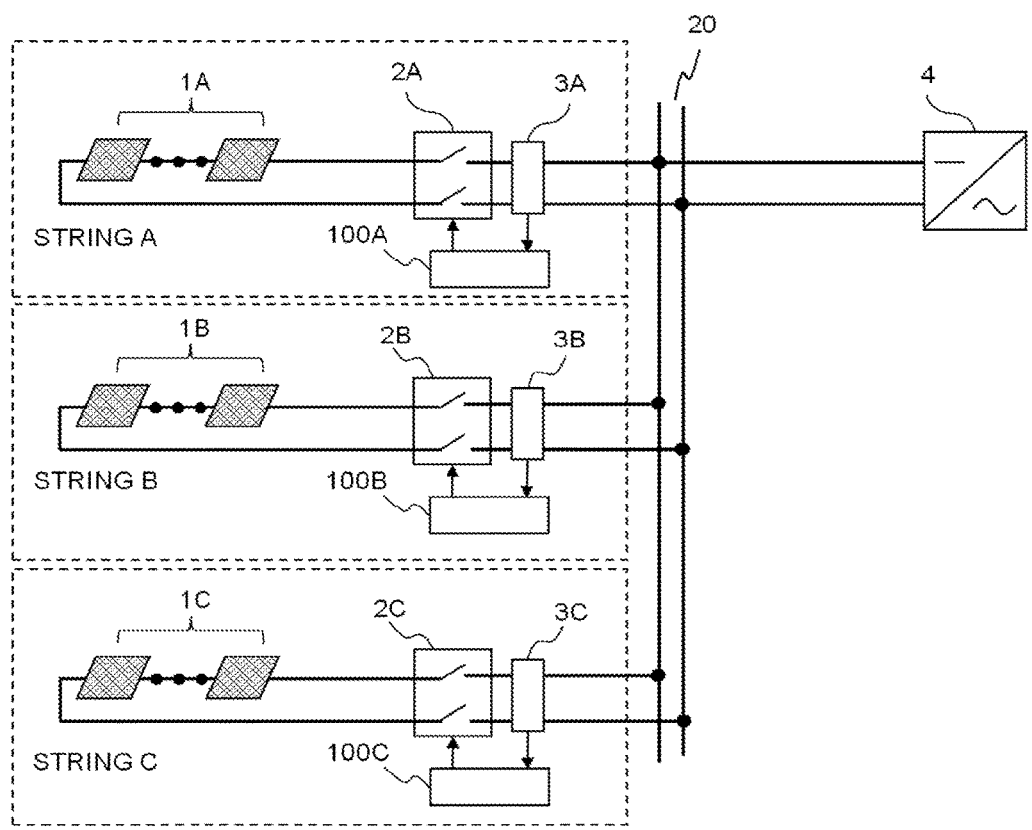
FIG. 1 is a circuit diagram showing the schematic configuration of DC power generation system according to EMBODIMENT 1 of this invention.

FIG. 1 is a circuit diagram showing a schematic configuration of a DC power generation system according to EMBODIMENT 1 of this invention. A string A comprises a plurality of DC power generation modules 1A which are connected in series and the string A is connected to a DC bus 20 via a switch 2A. In the same way, a string B comprises a plurality of DC power generation modules 1B which are connected in series, a string C comprises a plurality of DC power generation modules 1C which are connected in series, and the string B and the string C are connected to the DC bus 20 via a switch 2B or 2C, respectively. Regarding a mega solar system, in many cases, many pieces of the above-mentioned strings are provided, however, in FIG. 1, only three strings, the string A, the string B and the string C are shown. In the vicinity of the switch 2 (2A, 2B, 2C . . . ), a voltage-current sensor 3 (3A, 3B, 3C . . . ) is arranged, an arc detector 100 (100A, 100B, 100C . . . ) which detects an arc by inputting an output of the voltage-current sensor 3 is attached to each circuit. DC buses further merge at a side of a power conditioner 4. DC power which is generated by the DC power generation module 1 (1A, 1B, 1C) is converted to AC power of commercial frequency by the power conditioner 4 and is applied to customers such as an ordinary home and a factory via commercial power network. Hereinafter, a solar power generation system in which a solar power generation module (also refers to a solar power panel) 1 (1A, 1B, 1C . . . ) is used as a DC power generation module 1 (1A, 1B, 1C . . . ) will be described as an example.

Figure 2:
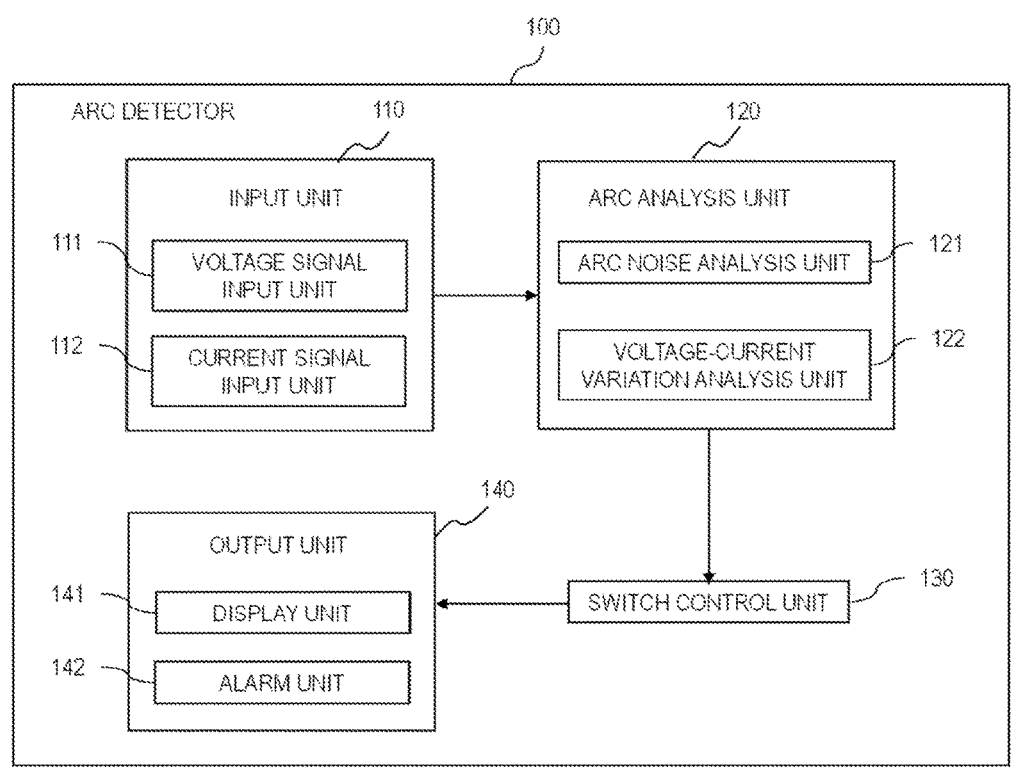
FIG. 2 is a block diagram showing the configuration of an arc detector of DC power generation system according to EMBODIMENT 1 of this invention.

FIG. 2 is a block diagram showing the configuration of an arc detector 100 of a DC power generation system according to EMBODIMENT 1 of this invention. An input unit 110 comprises a voltage signal input unit 111 and a current signal input unit 112. The input unit 110 fetches signal data of voltage and current which is detected by the voltage-current sensor 3 which is provided in the vicinity of the switch 2 to the arc detector 100. The data which is fetched is transmitted to an arc analysis unit 120. The arc analysis unit 120 comprises an arc noise analysis unit 121 and a voltage-current variation analysis unit 122. The arc noise analysis unit 121 detects high frequency noise when an arc occurs and judges such that an arc occurs. After it is judged such that an arc occurs in the arc noise analysis unit 121, in the voltage-current variation analysis unit 122, processing of specifying an arc occurrence point and an arc mode is performed. In the voltage-current variation analysis unit 122, it is judged whether an arc occurrence point is between solar panels and the voltage-current sensor 3, or between the voltage-current sensor 3 and the power conditioner 4. Further, it is judged whether a mode of an arc is a series arc or a parallel arc. When an arc occurs, a switch control unit 130 gives a command to trip only an appropriate switch 2 so as to continue operation in a sound section. Finally, presence or absence of arc occurrence, an arc occurrence point, an arc mode and a switch which is operated is displayed by a display unit 141 in an output unit 140 and when it is judged such that an arc occurs by an alarm unit 142, an alarm is sounded.

Figure 3:
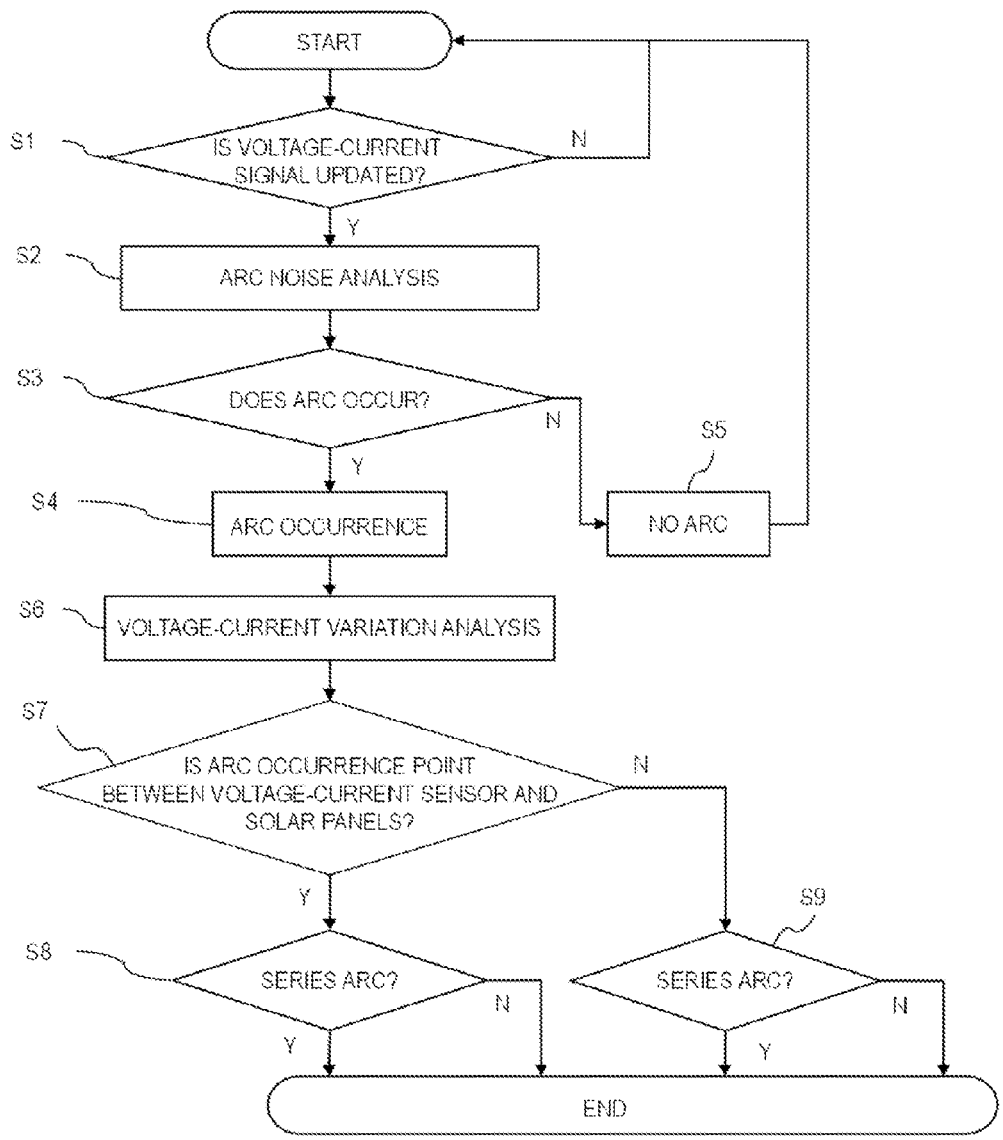
FIG. 3 is a flow chart for describing an operation of an arc detector of DC power generation system according to EMBODIMENT 1 of this invention.

FIG. 3 is a flow chart for describing an operation of an arc detector 100 of a DC power generation system according to EMBODIMENT 1 of this invention. In the arc detector 100, when a voltage-current signal which is inputted from the input unit 110 is updated (Step S1), an arc noise analysis (Step S2) is performed in the arc noise analysis unit 121. Based on a result of the arc noise analysis, occurrence of an arc in a DC power generation system is judged (Step S3). Step 2 and Step 3 will be referred as an arc detection step. When it is judged such that an arc occurs (Step 4), in the voltage-current variation analysis unit 122, voltage-current before an arc occurs and voltage-current after an arc occurs is analyzed (Step 6). In a case where it is judged such that an arc does not occur (Step S5), an operation will be returned to the beginning. In the voltage-current variation analysis unit 122, signal data of voltage and current for a predetermined period of time is stored, and in a case where it is judged such that an arc occurs, a variation pattern of voltage and current before and after an arc occurs is analyzed, and an arc occurrence point and an arc mode are determined. Whether an arc occurrence point is between a voltage-current sensor and solar panels or not is judged (Step 7). Step 6 and Step 7 will be referred to as a step for specifying an arc occurrence point. After a step for specifying an arc occurrence point is performed, it is judged whether an arc mode is series arc or not (Step 8, Step 9). Further, after a step for specifying an arc occurrence point is performed, in a switch control step which controls a switch, a switch is controlled.

A DC arc comprises a series arc and a parallel arc. First, a series arc will be described. When unexpected damage or cutting is generated on an electric wire which receives a load, between edges of a circuit part which is connected to the electric wire, an arc occurs. A series arc is an arc which occurs between solar panels, between a solar panel and a switch, between a switch and a power conditioner or between edges of damaged electric wire. A series arc occurs when a cable deteriorates, an execution error or lose screw, etc. occurs.

Next, a parallel arc will be described. A parallel arc occurs in a case where unexpected current flows between two conductors whose polarities are different. When animals bite an electric wire, the electric wire is deteriorated or the electric wire is damaged by exterior power, a parallel arc occurs, an insulator or a protection function might be lacked and when metal parts whose polarities are different are contacted, an arc occurs.

Figure 4:
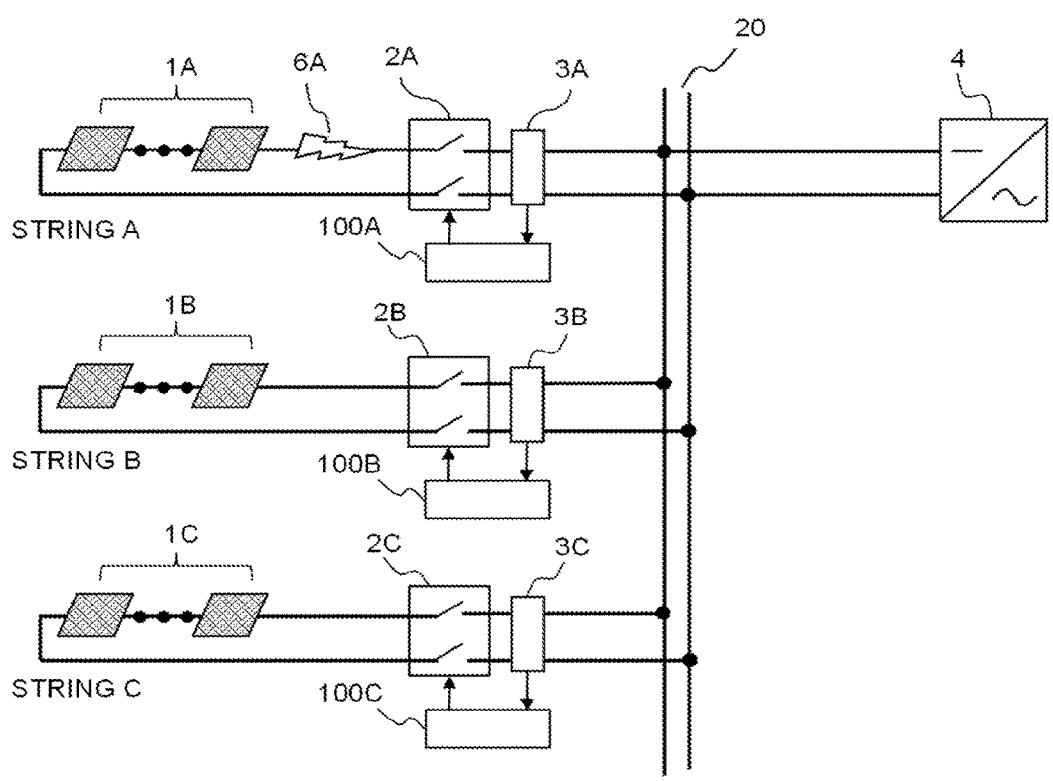
FIG. 4 is a schematic drawing for describing a state when a series arc occurs in a string in a DC power generation system according to EMBODIMENT 1 of this invention.

FIG. 4 is a schematic drawing for describing a state when a series arc 6A occurs between solar panels 1A and a voltage-current sensor 3A. A series arc which is similar to the series arc 6A may occur on a circuit between solar panels 1B and a voltage-current sensor 3B, or between solar panels 1C and a voltage-current sensor 3C. However, circuits are symmetry, therefore a case in which the series arc 6A occurs between the solar panels 1A and the voltage-current sensor 3A will be described as an example.

When a series arc or a parallel arc occurs, in general, arc noise having a range from 1 kHz to 1 MHz occurs. Arc noise has a characteristic of 1/f, and minute noise is imposed on whole of a circuit of solar power generation system. In comparison with noise strength when an arc does not occur, especially in a range from 1 kHz to 100 kHz, there is specific difference, therefore, as arc noise which is imposed on a current, by detecting high frequency noise in a range at least from 1 kHz to 100 kHz, occurrence of an arc can be judged. Propagation of arc noise is well-known. By cancelling noise from a power conditioner, occurrence of an arc can be easily detected. However, when occurrence of an arc is judged only by arc noise, in a plurality of parallel circuits, all of arc detectors will judge such that an arc occurs. This is because such that arc noise propagates through whole of a circuit. Therefore, this patent proposes an arc judgement method in which an arc occurrence point and an arc mode can be specified not only by arc noise but also by analyzing voltage-current variation characteristic.

Figure 5:
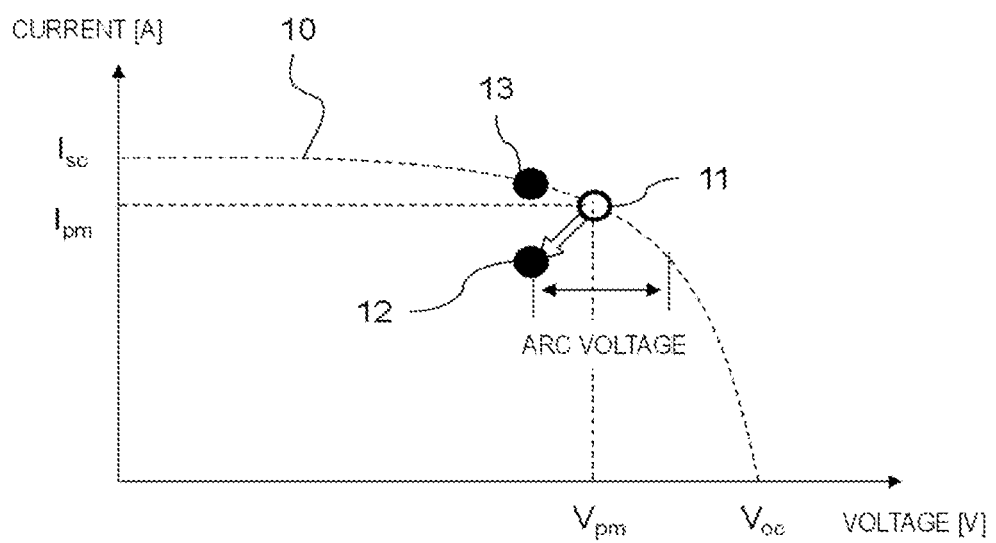
FIG. 5 is a drawing for describing variation of voltage-current when a series arc occurs in a string in a DC power generation system according to EMBODIMENT 1 of this invention.

FIG. 5 shows a voltage-current variation characteristic when a series arc occurs at a point shown in the schematic drawing of FIG. 4. A voltage-current characteristic of solar power generation depends on solar irradiance. The larger solar irradiance is, the more maximum operation output current Ipm increases, and the smaller solar irradiance is, the smaller maximum operation output current Ipm is. Further, regardless of solar irradiance, maximum operation output voltage Vpm does not greatly variate. By control of the power conditioner 4, an operation point 11 which is maximum power is continued at all times. As a result, an output of maximum operation output voltage Vpm and maximum operation output current Ipm is an operation point at normal time. Further, at each string, when a string itself is normal, output voltage Voc in a case where a load is open and output current Isc in a case where a load is a short circuit are determined, in accordance with a state of a load, an operation point is on a voltage-current characteristic curve 10.

When a series arc 6A occurs between a solar panel 1A and a voltage-current sensor 3A, voltage and current of the voltage-current sensor 3A decreases and an operation point is an operation point 12 after an arc occurs. The operation point 12 is an operation point which deviates from the voltage-current characteristic curve 10 of normal operation. When an arc occurs, voltage-current variates in a range of several us to several tens μs, therefore, time which is required to move from an operation point 11 before an arc occurs to the operation point 12 after an arc occurs is 1 ms or less, that is, the speed is fast. In comparison with a variation of an operation point caused by weather or a power conditioner, the speed is extremely fast. A decreasing amount of voltage depends on arc voltage, and arc voltage depends on maximum operation current. When an arc occurs, circuit impedance increases and a current decreases. Voltage of a voltage-current sensor 3B and 3C of a string in which a series arc does not occur decreases, current increases and an operation point is an operation point 13. Voltage-current of a string in which a series arc does not occur operates on the voltage-current characteristic curve 10 of a solar power generation, therefore current increases in accompany with decrease of voltage.

Figure 6:
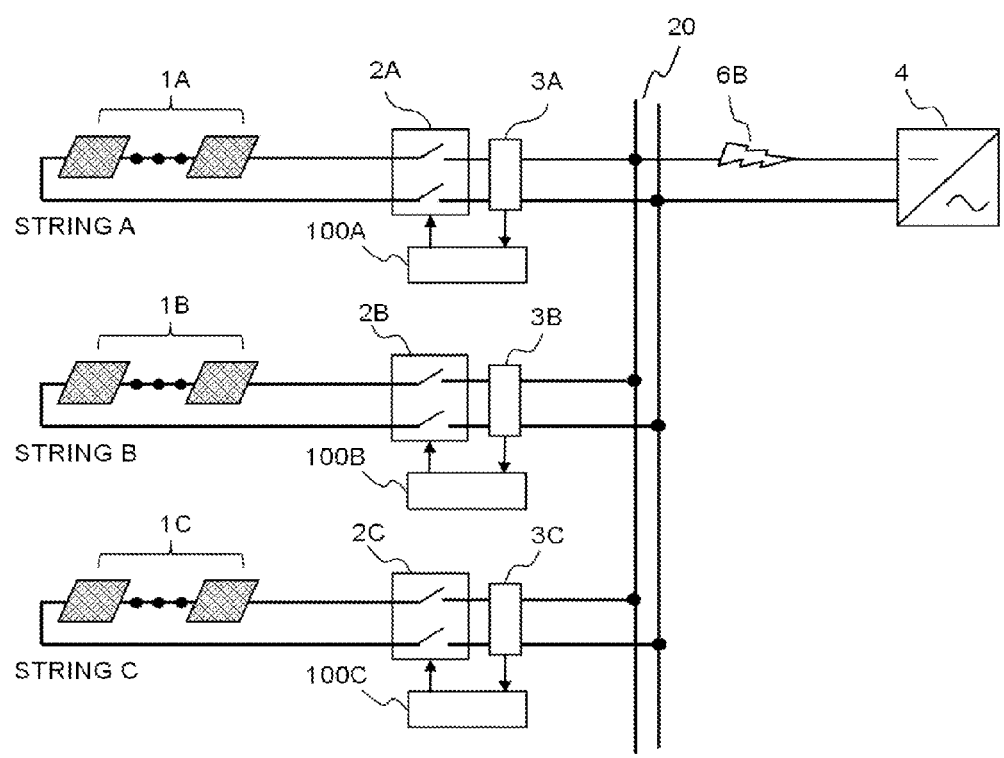
FIG. 6 is a schematic drawing for describing a state when a series arc occurs outside a string in a dc power generation system according to EMBODIMENT 1 of this invention.
Figure 7:
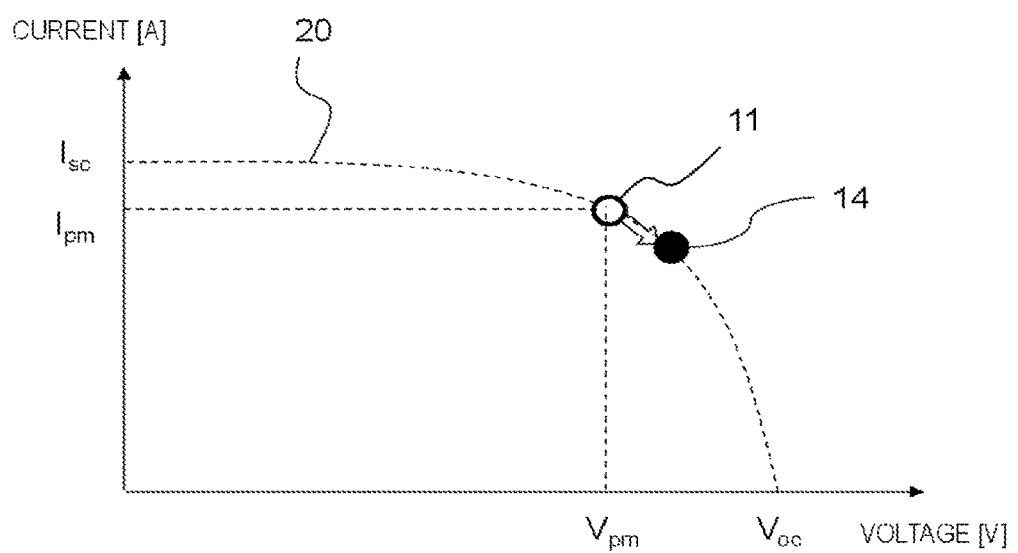
FIG. 7 is a drawing for describing variation of voltage-current when a series arc occurs outside a string in a DC power generation system according to EMBODIMENT 1 of this invention.

FIG. 7 shows a voltage-current variation characteristic when a series arc occurs at a point shown in a schematic drawing of FIG. 6. When a series arc 6B occurs between a voltage-current sensor 3A and a power conditioner 4, voltage of the voltage-current sensor 3A increases and current of the voltage-current sensor 3A decreases. At this time, an operation point is an operation point 14 after an arc occurs. This is because such that circuit impedance increases and current decreases due to occurrence of an arc. The operation point 14 is an operation point on the voltage-current characteristic curve 10 of normal operation. In the same ways, regarding a voltage-current sensor 3B of a string B and a voltage-current sensor 3C of a string C, voltage increases and current decreases. At this time, the operation point 14 of the string B and the string C after an arc occurs coincides with an operation point of the string A after an arc occurs. As circuits are symmetry, variation amount of voltage and that of current are same.

Next, a parallel arc will be described. FIG. 9 shows a voltage-current variation characteristic when a parallel arc 7A occurs at a point shown in a schematic drawing of FIG. 8. When a parallel arc 7 occurs between solar panels 1A and a voltage-current sensor 3A, voltage and current of the voltage-current sensor 3A decreases and an operation point is an operation point 15 after an arc occurs. Voltage of the operation point 15 is nearly arc voltage (10V to 40V), and current flows backward from other strings, therefore, excessive current flows backward. The operation point 15 is an operation point which greatly deviates from the voltage-current characteristic curve 10 of normal operation. On the other hand, voltages of a voltage-current sensors 3B and 3C of other strings decrease, and an operation point is an operation point 16 after an arc occurs. Voltage of the operation point 16 is nearly arc voltage (10V to 40V), and a value of current is same as that of short circuit current. As shown in FIG. 9, an operation point 16 of a string in which an abnormality is not caused is on the voltage-current characteristic curve 10 of normal operation.

Figure 10:
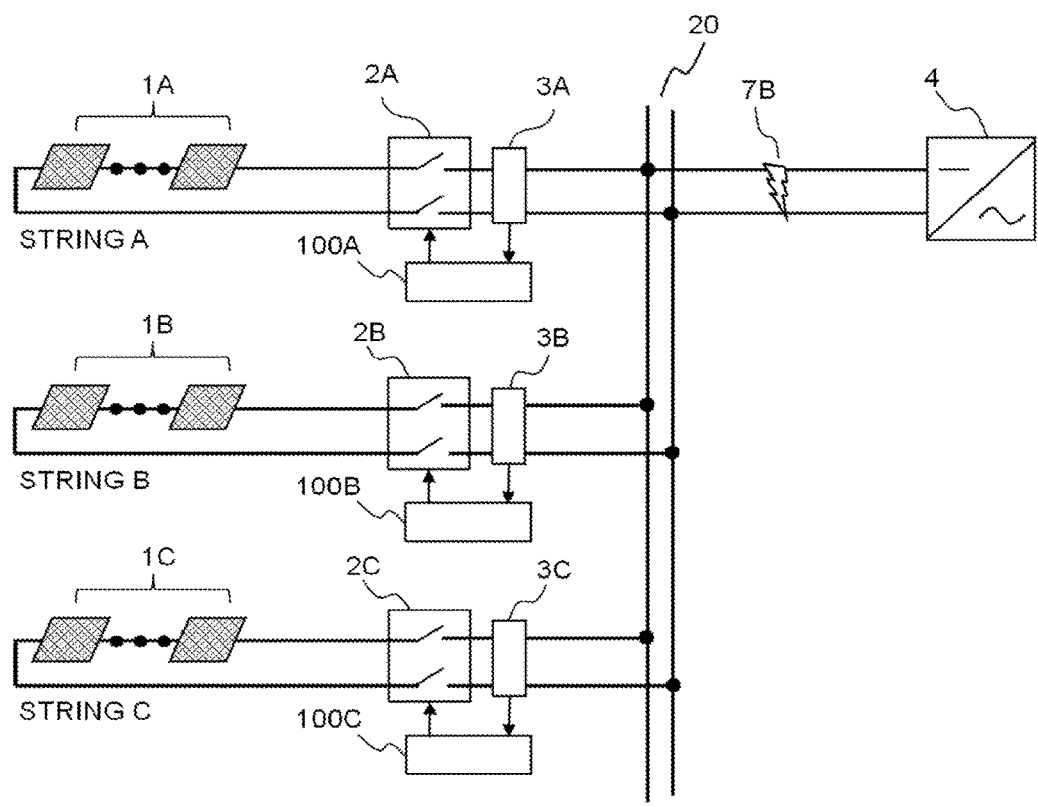
FIG. 10 is a schematic drawing for describing a state when a parallel arc occurs outside a string in a DC power generation system according to EMBODIMENT 1 of this invention.
Figure 11:
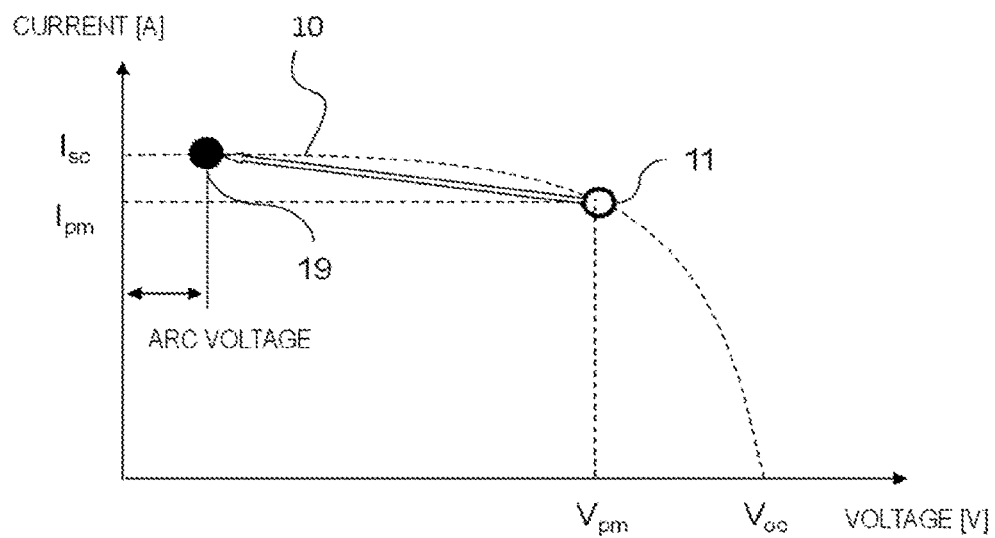
FIG. 11 is a drawing for describing variation of voltage-current when a parallel arc occurs outside a string in a DC power generation system according to EMBODIMENT 1 of this invention.

Next, FIG. 11 shows a voltage-current variation characteristic when a parallel arc 7B occurs at a point shown in a schematic drawing of FIG. 10. When a parallel arc 7B occurs between a voltage-current sensor 3A and a power conditioner 4, voltage of the voltage-current sensor 3A decreases, current of the voltage-current sensor 3A increases and an operation point is an operation point 19 after an arc occurs. Voltage of the operation point 19 is nearly arc voltage (10V to 40V), and a value of current is close to that of short circuit current Isc based on the voltage-current characteristic curve 10. As shown in FIG. 11, an abnormality is not caused in strings. Therefore, an operation point 16 is an operation point on the voltage-current characteristic curve 10 of normal operation. Operation points of other strings coincide with an operation point 19. As circuits are symmetry, variation amount of voltage and that of a current are same.

An operation of a switch control unit 130, that is, an operation of a switch control step will be determined after an arc occurrence point is judged. When a series arc 6A shown in FIG. 4 occurs, an arc detector 100A of the string A to which a signal of a sensor which shows a variation of voltage-current of an operation point 12 after an arc shown in FIG. 5 occurs trips a switch 2A in the vicinity of a voltage-current sensor 3A. By doing the above-mentioned, current flowing from a solar power generation stops so as to extinguish a series arc. When the switch 2A is tripped, an operation point of a string B and that of a string C are returned from an operation point 13 to an operation point 11, and an operation of the DC generation system can be continued by the string B and the string C.

When a series arc 6B shown in FIG. 6 occurs, as voltage-current operation point after an arc occurs shown in FIG. 7, when an operation point 14 is continued for a predetermined period of time, all of arc detectors 100A, 100B and 100C trip a switch 2A, 2B and 2C, respectively. By doing the above-mentioned, current flowing from a solar power generation stops so as to extinguish a series arc.

Figure 8:
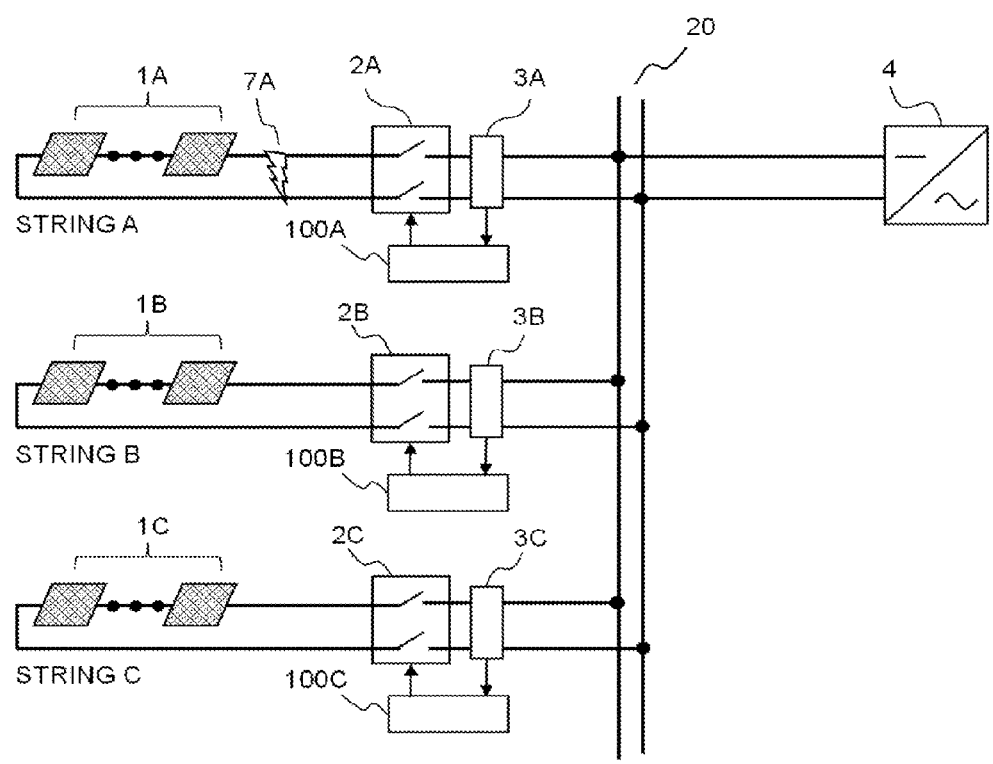
FIG. 8 is a schematic drawing for describing a state when a parallel arc occurs in a string in a DC power generation system according to EMBODIMENT 1 of this invention.
Figure 9:
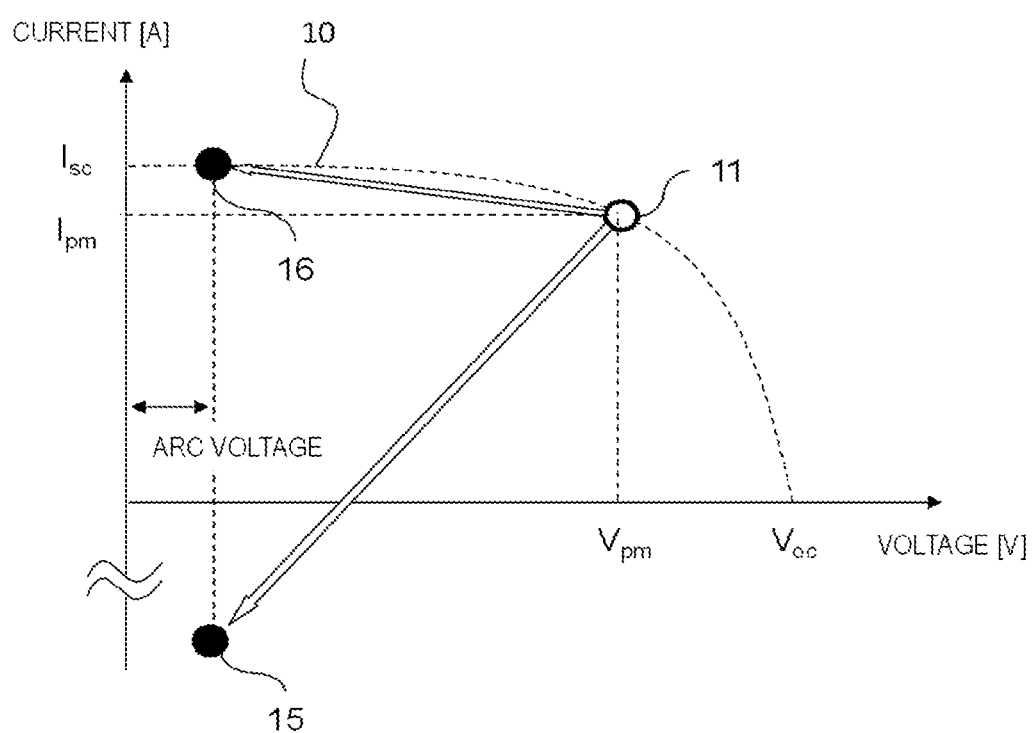
FIG. 9 is a drawing for describing variation of voltage-current when a parallel arc occurs in a string in a DC power generation system according to EMBODIMENT 1 of this invention.

When a parallel arc 7A shown in FIG. 8 occurs, an arc detector 100A to which a signal of a sensor which shows a variation of voltage-current of an operation point 15 after an arc occurs shown in FIG. 9 trips the switch 2A in the vicinity of the voltage-current sensor 3A.

In a case where a parallel arc 7B shown in FIG. 10 occurs, when a voltage-current variation to an operation point 19 after an arc occurs shown in FIG. 11 continues for a predetermined period of time, all of arc detectors 100A, 100B and 100C trip a switch 2A, 2B and 2C, respectively.

As above mentioned, when it is judged such that an arc occurs in an arc analysis unit 121, in a voltage-current variation analysis unit 122 of arc detector 100 of each string, a voltage-current operation point before and after an arc occurs is analyzed, when a voltage-current operation point, after an arc occurs, deviates from a voltage-current characteristic curve of normal operation, it is judged such that an arc occurs in the own string, and the own switch 2 provided in the own string is tripped. When a voltage-current operation point after an arc occurs is on a voltage-current characteristic curve of normal operation, it is judged such that an arc occurs outside the own string, and when a voltage-current operation point which is different from an operation point 11 is continued for a predetermined time, the own switch 2 provided in the own string is tripped. As shown in FIG. 4 and FIG. 8, in a case where an arc occurs in the string A, first, the switch 2A of the string A is tripped, an operation point of the string A or the string B returns to an operation point 11, therefore it is not necessary to trip the switch 2B and the switch 2C. Further, as shown in FIG. 6 and FIG. 10, in a case where an arc occurs outside strings, an operation point 14 and an operation point 19 on a voltage-current characteristic curve of normal operation are continued, therefore in a case where these operation points are continued for a predetermined period of time, all of the switches 2A, 2B and 2C are tripped, and as a result, the DC power generation system is protected.

Figure 12:
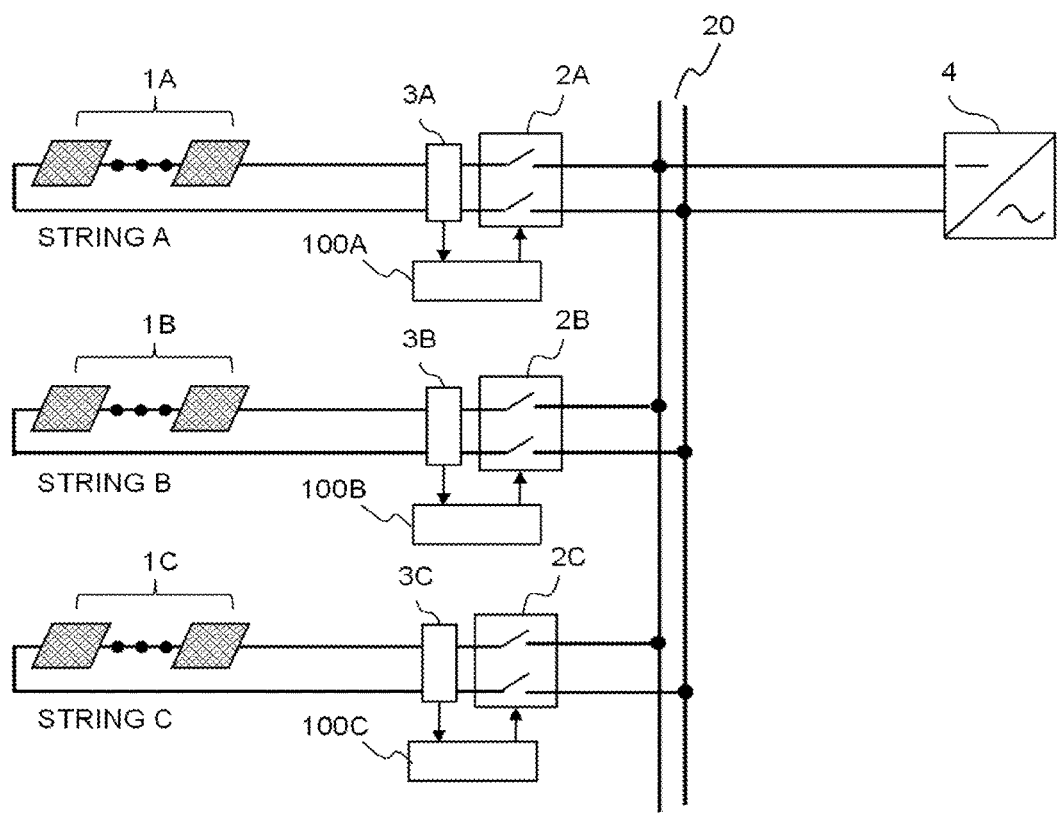
FIG. 12 is a circuit diagram showing another schematic configuration of DC power generation system according to EMBODIMENT 1 of this invention.

Further, according to this patent, as shown in FIG. 12, even in a case where a voltage-current sensor 3 (3A, 3B, 3C . . . ) is provided between a switch and solar panels, an arc can be detected by similar protection method. This is because such that a voltage-current variation while a switch is closed is same.

Figure 13:
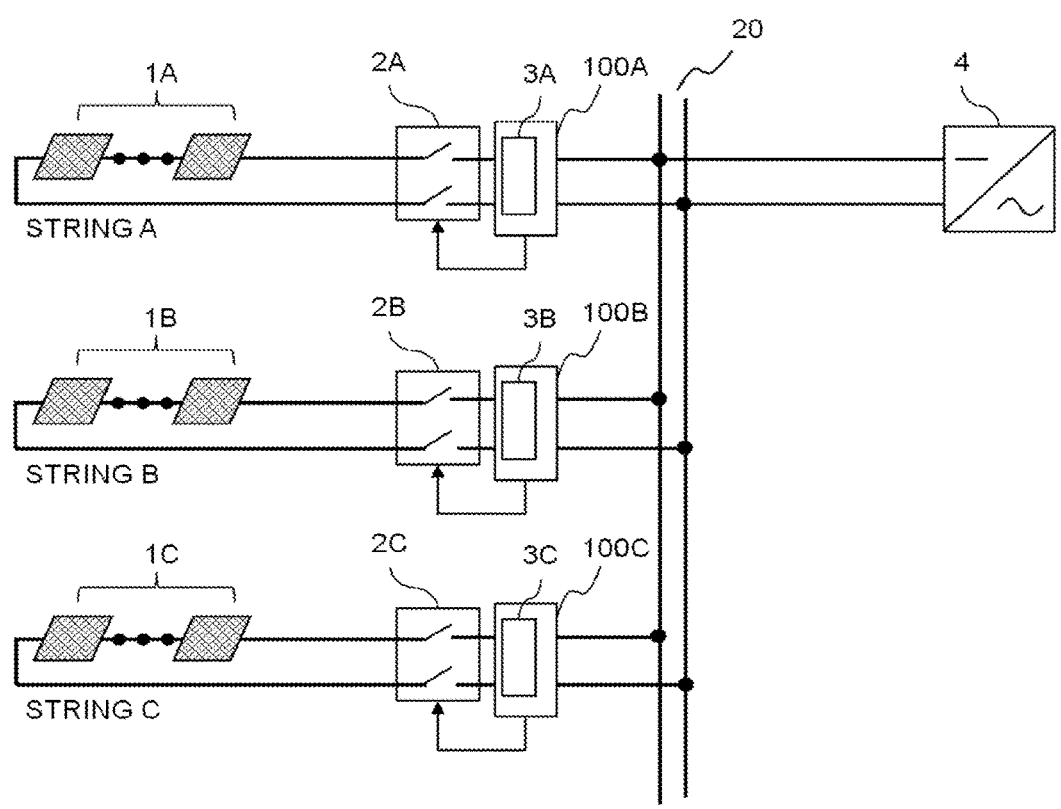
FIG. 13 is a circuit diagram showing another schematic configuration of DC power generation system according to EMBODIMENT 1 of this invention.

Further, according to this patent, as shown in FIG. 13, even in a case where an arc detector 100 (100A, 100B, 100C . . . ) and a voltage-current sensor 3 (3A, 3B, 3C . . . ) are integrated, arc protection can be realized by similar arc analysis. As long as voltage and current which are outputted from a voltage-current sensor 3 (3A, 3B, 3C . . . ) can be transmitted, installation location is not limited.

Embodiment 2

Figure 14:
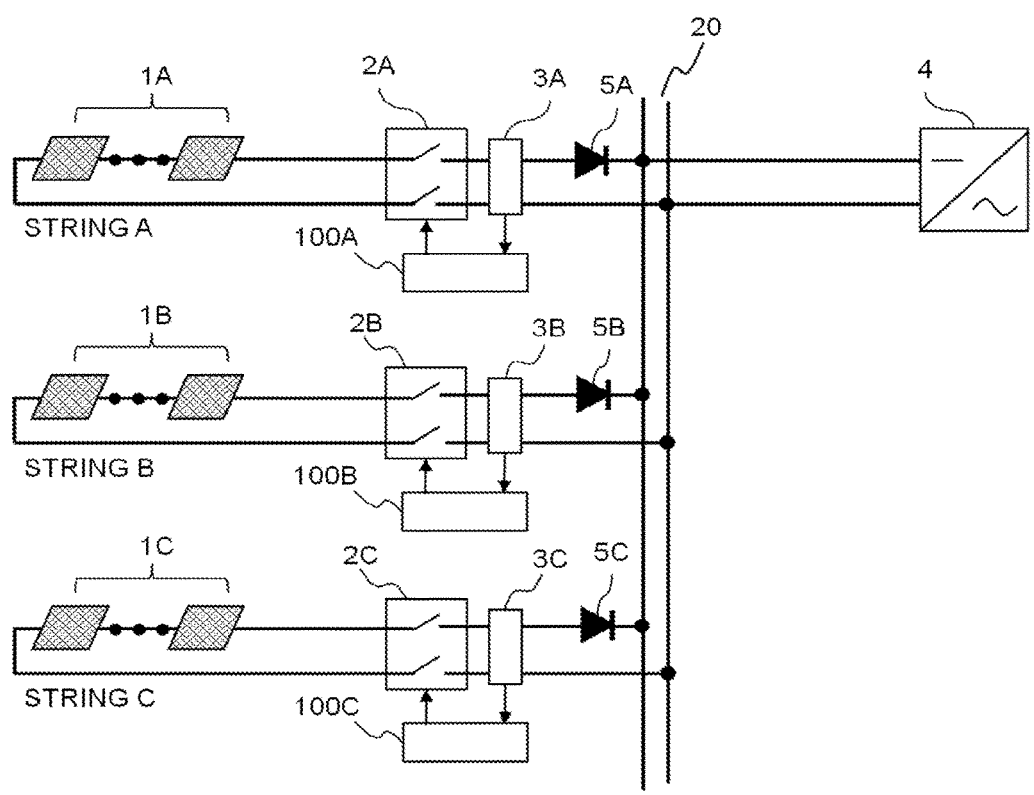
FIG. 14 is a circuit diagram showing a schematic configuration of DC power generation system according to EMBODIMENT 2 of this invention.

This patent includes an application to a solar power generation system at which a backflow prevention diode 5 (5A, 5B, 5C . . . ) as shown in FIG. 14 is provided. Regarding the backflow prevention diode 5, there are two cases, that is, a case in which the backflow prevention diode 5 is provided in a direction of a current which flows from solar power panels 1 to a power conditioner 4, to a cable which is provided at a positive electrode side, and a case in which the backflow prevention diode 5 is provided in a direction of a current which flows from the power conditioner 4 to a side of the solar panels 1, to a cable which is provided at a negative electrode side. Hereinafter, a case in which the backflow prevention diode 5 is provided at a cable which is provided at a positive electrode side will be described as an example.

Figure 15:
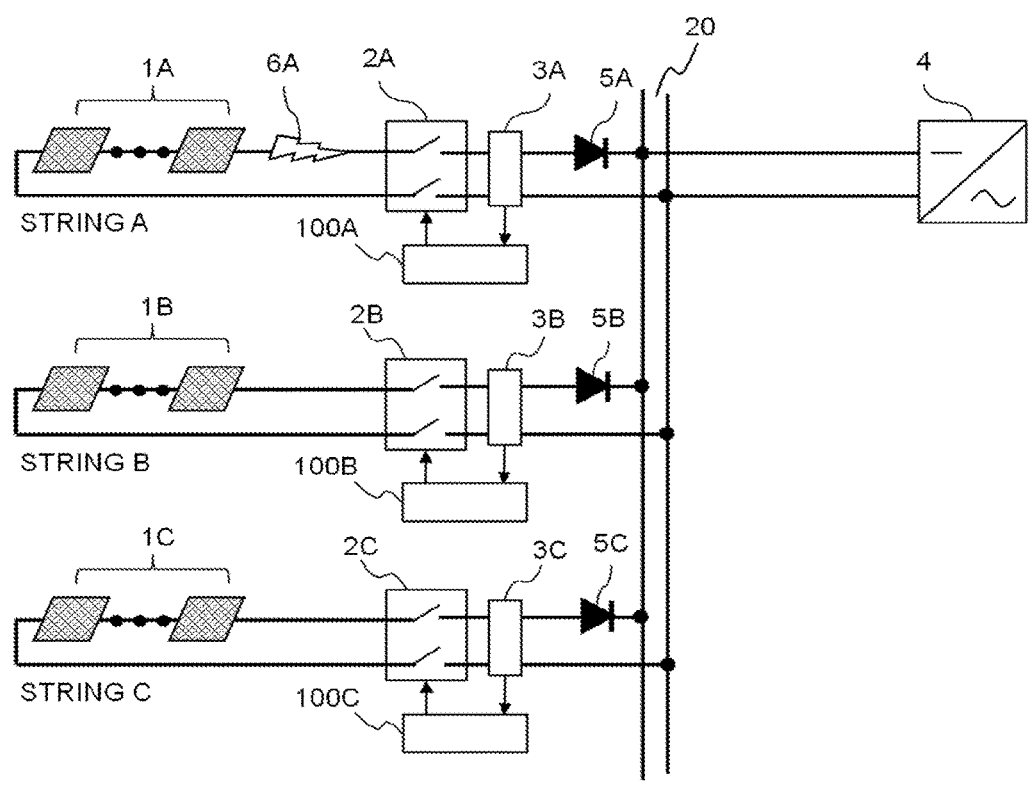
FIG. 15 is a schematic drawing for describing a state when a series arc occurs in a string in a DC power generation system according to EMBODIMENT 2 of this invention.

In a case where, as shown in a schematic view of FIG. 15, the backflow prevention diode 5 (5A, 5B, 5C . . . ) is provided and a series arc occurs between a voltage-current sensor 3A and solar power panels 1A, a voltage-current variation characteristic is same as that shown in FIG. 5. When a series arc 6A occurs between the solar power panels 1A and the voltage-current sensor 3A, voltage and current of the voltage-current sensor 3A decreases and an operation point is an operation point 12 after an arc occurs.

Figure 16:
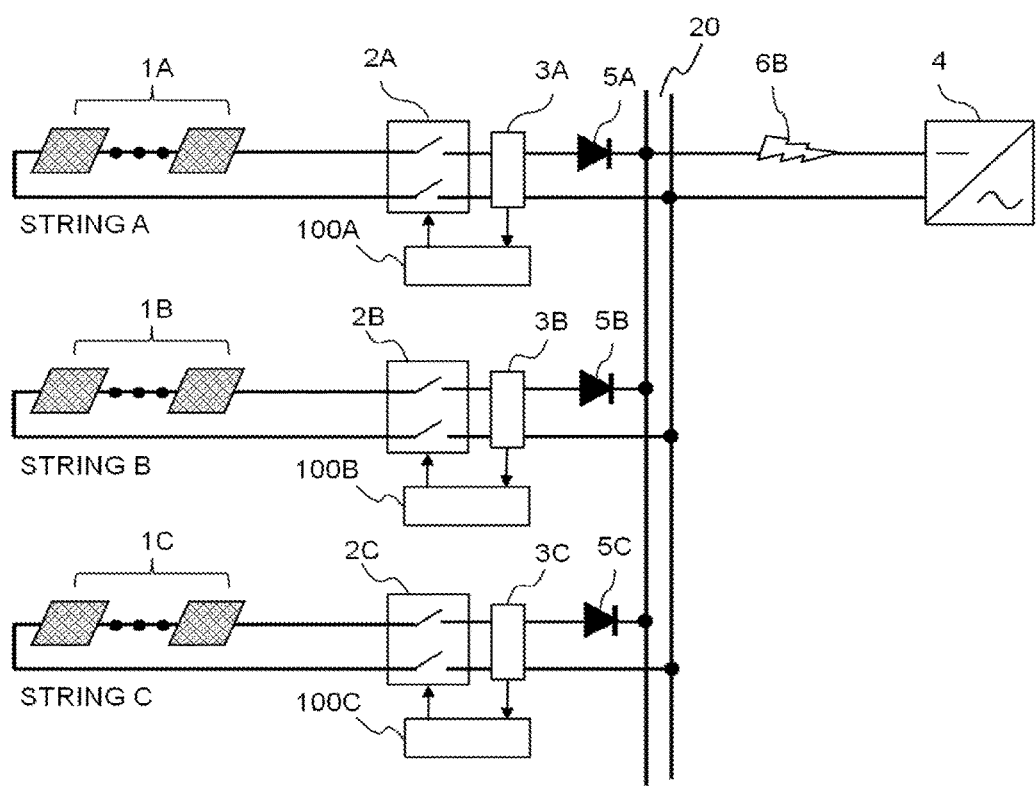
FIG. 16 is a schematic drawing for describing a state when a series arc occurs outside a string in a DC power generation system according to EMBODIMENT 2 of this invention.

In a case where, as shown in a schematic view of FIG. 16, the backflow prevention diode 5 (5A, 5B, 5C . . . ) is provided and a series arc occurs between a DC bus to which a plurality of strings are connected and the power conditioner 4, a voltage-current variation characteristic is same as that shown in FIG. 7. In this case, voltage of a voltage-current sensor 3A, 3B and 3C of each string increases and current decreases. At this time, at each string, an operation point is an operation point 14.

Figure 17:
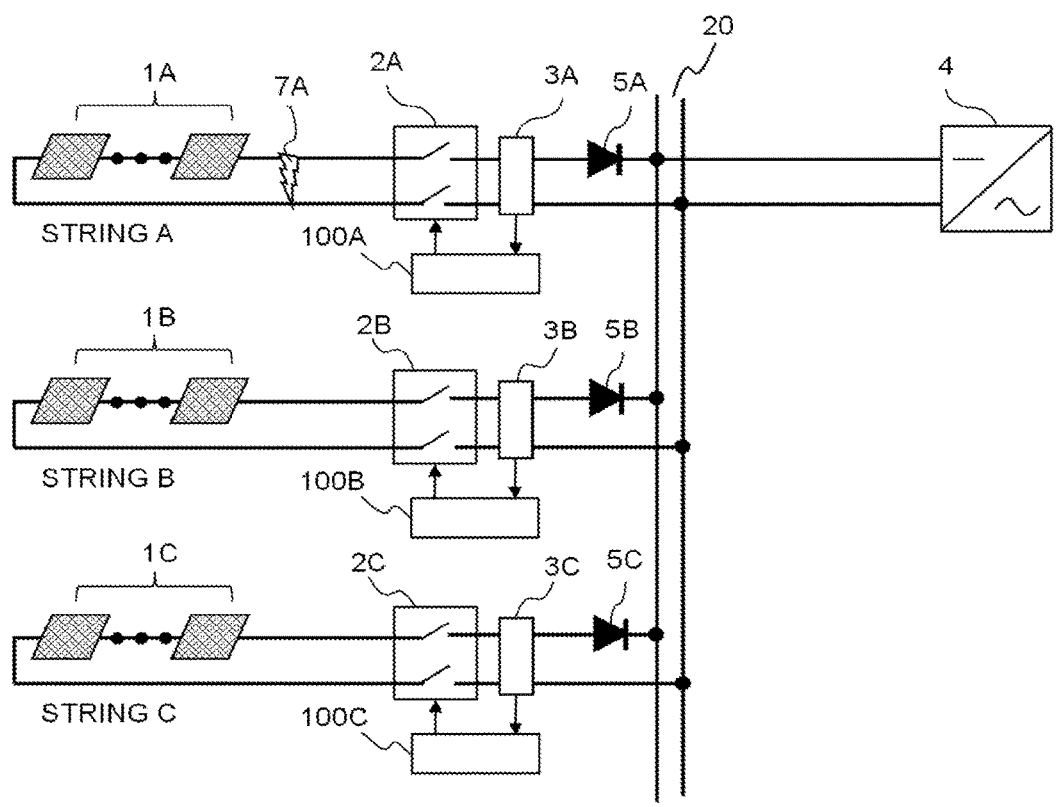
FIG. 17 is a schematic drawing for describing a state when a parallel arc occurs in a string in a DC power generation system according to EMBODIMENT 2 of this invention.
Figure 18:
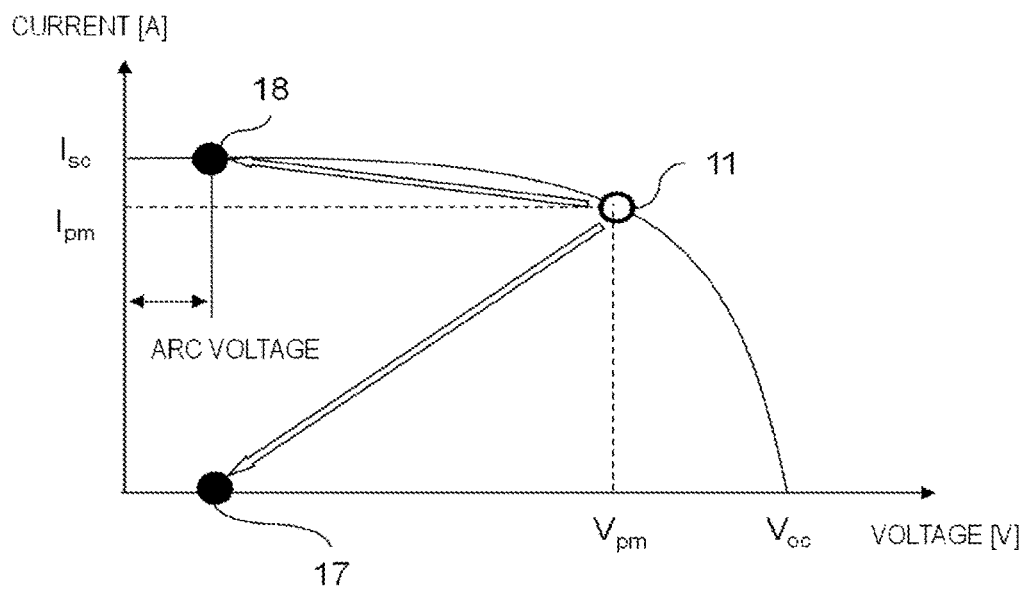
FIG. 18 is a drawing for describing variation of voltage-current when a parallel arc occurs in a string in a DC power generation system according to EMBODIMENT 2 of this invention.

In a case where, as shown at a point of a schematic view of FIG. 17, the backflow prevention diode 5 (5A, 5B, 5C . . . ) is provided and a parallel arc occurs in a string A, a voltage-current variation characteristic will be shown in FIG. 18. When a parallel arc 7A occurs between the solar power panels 1A and the voltage-current sensor 3A in a solar power generation system to which a backflow prevention diode is connected, voltage and current of the voltage-current sensor 3A decreases and an operation point is an operation point 17 after an arc occurs. Voltage of the operation point 17 is nearly arc voltage (10V to 40V), and current is not outputted from the solar power panels 1A and a backward flow from other strings is prevented by a backflow prevention diode. As a result, current is 0. On the other hand, voltage of the voltage-current sensor 3B and 3C of other strings decreases and current increases, and an operation point is an operation point 18 of other circuit after an arc occurs. Voltage of the operation point 18 is nearly arc voltage (10V to 40V), and current is an equal value of a short circuit current value.

Figure 19:
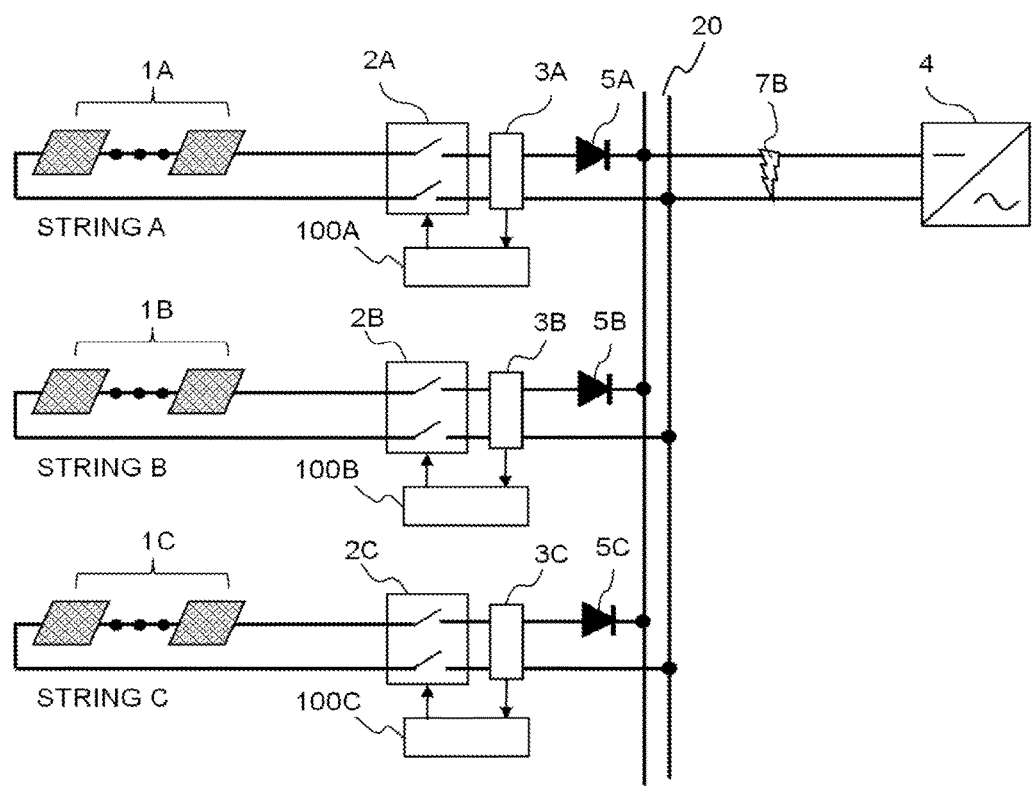
FIG. 19 is a schematic drawing for describing a state when a parallel arc occurs outside a string in a DC power generation system according to EMBODIMENT 2 of this invention.

In a case where, as shown in a schematic view of FIG. 19, a backflow prevention diode is provided and a parallel arc 7B occurs, a voltage-current variation characteristic is same as that shown in FIG. 11. Voltage of the voltage-current sensor 3A decreases and current increases and an operation point is an operation point 19 after an arc occurs. Voltage of the operation point 19 is nearly arc voltage (10V to 40V), and a value of current is close to a value of a short circuit current Isc based on the voltage-current characteristic curve 10. An operation point of the string B and the string C after an arc occurs coincides with the operation point 19 of the string A.

In a case of FIGS. 15, 16 and 19, an operation of a switch control unit 130 is same as that of a switch operation command in a case of FIG. 4, FIG. 6 and FIG. 10. As shown in FIG. 17, when a parallel arc occurs, an arc detector, to which a signal of a sensor which indicates a voltage-current variation of an operation point after an arc occurs 18 is inputted, trips a switch 2A in the vicinity of the voltage-current sensor 3A.

Embodiment 3

Figure 20:
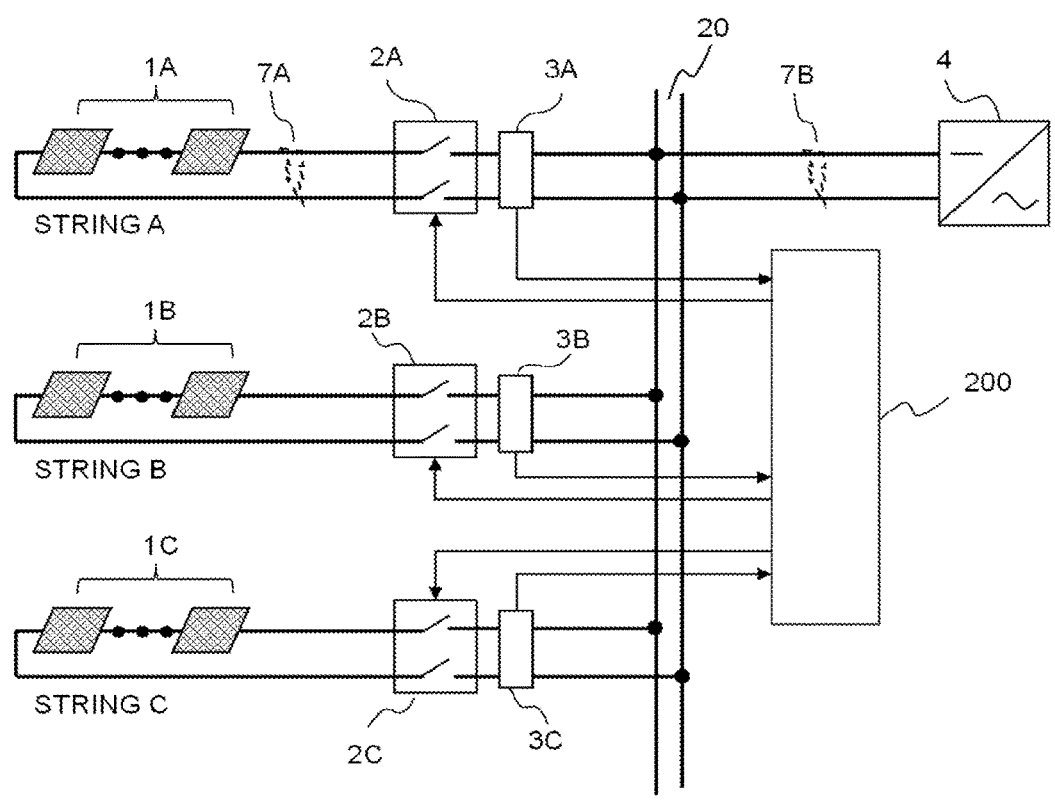
FIG. 20 is a circuit diagram showing a schematic configuration of DC power generation system according to EMBODIMENT 3 of this invention.

FIG. 20 is a schematic circuit diagram showing the configuration of DC power generation system according to EMBODIMENT 3 of this invention. In EMBODIMENT 1 and EMBODIMENT 2, it is configured such that an arc detector 100 which is provided at each string judges whether to trip a switch 2 of the own string or not. In EMBODIMENT 3, it is configured such that data which is transmitted from a voltage-current sensor 3 (3A, 3B . . . ) which is provided at each string is analyzed by one arc detector 200 so as to judge an arc occurrence point and an arc mode, and output an appropriate switch operation command.

For example, when a parallel arc 7A occurs between solar panels 1A and a voltage-current sensor 3A of a string A, an operation point in the voltage-current sensor 3A of the string A is an operation point 15 shown in FIG. 9 and an operation point of a voltage-current sensor 3B of a string B and an operation point of a voltage-current sensor 3C of a string C is an operation point 16 shown in FIG. 9. Further, when a parallel arc 7B occurs at a DC bus 20 or at a side closer to a power conditioner 4 than the DC bus 20, an operation point in the voltage-current sensor 3 of each string is an operation point 19 shown in FIG. 11. Here, an operation point 16 shown in FIG. 9 and an operation point 19 shown in FIG. 11 are nearly same operation point. According to the configuration of EMBODIMENT 1 and EMBODIMENT 2, occurrence of an arc is judged separately at each string, therefore, at a string B and a string C, it is difficult to judge whether a parallel arc occurs in the string A or a parallel arc occurs at the DC bus 20 or at a side which is closer to the power conditioner 4 than the DC bus 20. Consequently, in EMBODIMENT 1, in a case where it is judged such that an arc occurs outside the own string, when an operation point is continued for a predetermined period of time, it is configured such that a switch is tripped so as to separate the own string.

In EMBODIMENT 3, as shown in FIG. 20, when signals from a voltage-current sensors 3 (3A, 3B . . . ) of all strings are inputted and judged comprehensively by an arc detector 200, an arc occurrence point can be appropriately judged. That is, as shown in FIG. 9, in a case where an operation point in the string A is an operation point 15 and an operation point of other string is an operation point 16, it can be judged such that a parallel arc 7 occurs in the string A, and in this case, only a switch 2A is tripped. On the other hand, as shown in FIG. 11, in a case where an operation point of all strings is an operation point 19, it can be judged such that a parallel arc 7B occurs at the DC bus 20 or at a side closer to the power conditioner 4 than the DC bus 20, immediately, the switches 2A, 2B and 2C of all strings are tripped.

As above mentioned, when signals of the voltage-current sensors 3 (3A, 3B, . . . ) which are provided at each string are analyzed by one arc detector 200, an arc occurrence point can be judged more appropriately, and more appropriate command can be sent to each switch. Especially, in a case where an arc occurs outside a string, unlike EMBODIMENT 1, without waiting until an abnormal operation point is continued for a predetermined period of time, immediately, all strings can be separated.

Embodiment 4

Figure 21:
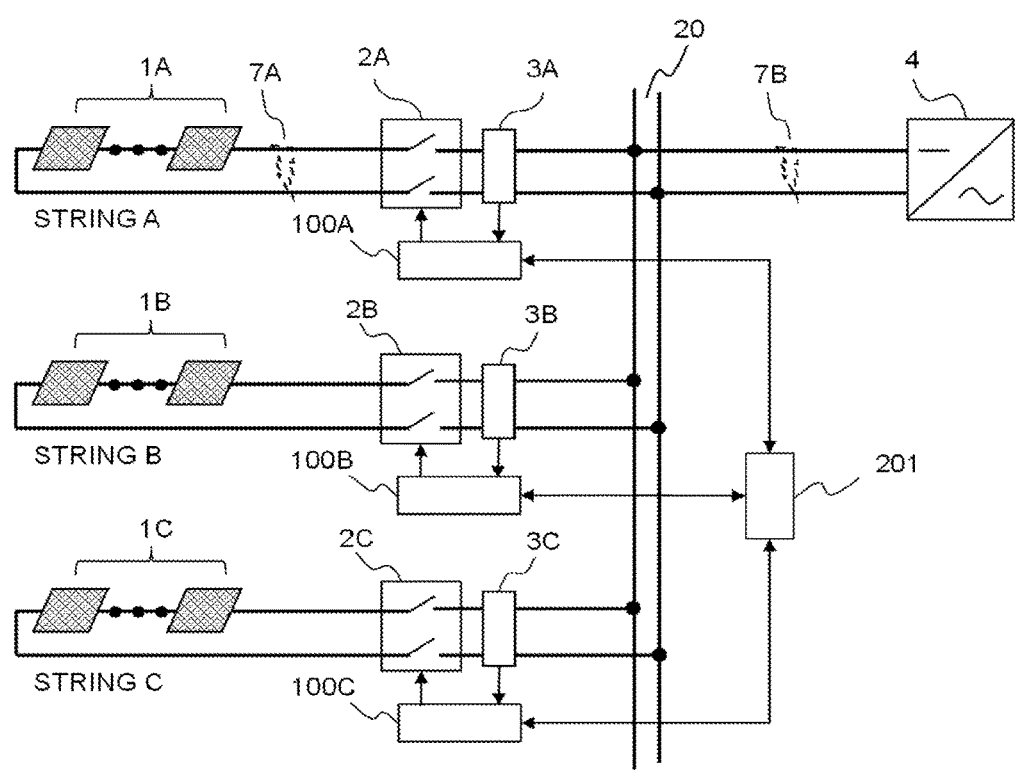
FIG. 21 is a circuit diagram showing a schematic configuration of DC power generation system according to EMBODIMENT 4 of this invention.

FIG. 21 is a schematic circuit diagram showing the configuration of DC power generation system according to EMBODIMENT 4 of this invention. In EMBODIMENT 4, an arc detector 100 (100A, 100B . . . ) which is provided at each string judges whether an arc occurs in the own string or not and a result of judgement is transmitted to an arc occurrence point specifying device 201. Signals from all of arc detectors 100 (100A, 100B . . . ) are inputted in the arc occurrence point specifying device 201 and judged comprehensively so as to specify an arc occurrence point.

In a case where results of judgement such that a parallel arc occurs outside each of the own string are inputted from arc detectors 100 of all strings, the arc occurrence point specifying device 201 judges such that a parallel arc 7B occurs at a DC bus 20 or at a side which is closer to a power conditioner 4 than the DC bus 20, a command is transmitted to all of arc detectors 100 so as to trip switches 2 (2A, 2B . . . ) of all strings. In a case where results of judgement such that a series arc occurs outside each of the own string are inputted from arc detectors 100 of all strings, it is judged such that a series arc occurs at a DC bus 20 or at a side which is closer to a power conditioner 4 than the DC bus 20, and a command is transmitted to all of arc detectors 100 so as to trip switches 2 (2A, 2B . . . ) of all strings.

On the other hand, in a case where a result of judgement such that a parallel arc occurs in the own string is inputted from an arc detector of one string, for example, an arc detector 100A of the string A, and results of judgement such that a parallel arc occurs outside the own string are inputted from arc detectors of other strings, the arc occurrence point specifying device 201 transmits a command not to trip switches other than a switch of the string A to arc detectors or switches of strings other than the string A. In a case of a series arc, similar procedure is performed.

In the above-mentioned, an arc detector, which judges such that an arc occurs in the own string, immediately trips the own switch. On the other hand, an arc detector, which judges such that an arc occurs outside the own string, trips the own switch when a signal from the arc occurrence specifying device 201 is received.

According to a DC power generation system of EMBODIMENT 4, in a case where an arc occurs outside a string, unlike EMBODIMENT 1, without waiting until an abnormal operation point is continued for a predetermined period of time, an occurrence point is specified by the arc occurrence point specifying device 201, therefore more appropriate arc occurrence point can be specified.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

1, 1A, 1B, 1C solar power panel
2, 2A, 2B, 2C switch
3, 3A, 3B, 3C voltage-current sensor
4 power conditioner
5A, 5B, 5C diode
6A, 6B series arc
7A, 7B parallel arc
100 arc detector
110 input unit
120 arc analysis unit
121 arc noise analysis unit
122 voltage-current variation analysis unit
130 switch control unit

The invention claimed is:

1. A DC power generation system in which a plurality of strings, comprising a plurality of DC power generation modules, are connected in series and are connected to a DC bus in parallel, and power is supplied to the DC bus,
wherein each string has a voltage-current sensor which detects an output voltage and an output current of the string and a switch which intercepts connecting to the DC bus of the string at an output side; and has an arc detector comprising;
an arc noise analysis unit which detects an arc which occurs in the DC power generation system based on noise of a signal of the voltage-current sensor,
a voltage-current variation analysis unit in which, in a case where an arc is detected in the arc noise analysis unit, a voltage-current operation point of output of each string is analyzed based on a signal from the voltage-current sensor, and an occurrence point of the arc is specified based on variation of the voltage-current operation point before and after when the arc is detected, and
a switch control unit which controls to open or close the switch based on an arc specified result in the voltage-current variation analysis unit.

2. The DC power generation system as in claim 1, in which the arc noise analysis unit detects an arc based on high frequency noise whose range is at least from 1 kHz to 100 kHz.

3. The DC power generation system as in claim 1, in which the arc detector is provided at the each string, the each arc detector specifies whether an arc occurs or not in the own string based on variation of voltage-current operation point before and after when the arc is detected in the own voltage-current variation analysis unit, in a case where the arc detector specifies such that an arc occurs in the own string, the arc detector trips a switch which is provided at the own string.

4. The DC power generation system as in claim 1, in which the arc detector is provided at the each string, the each detector specifies whether an arc occurs or not in the own string based on variation of a voltage-current operation point before and after when the arc is detected in the own voltage-current variation analysis unit, in a case where the arc detector specifies such that an arc occurs outside the own string, and in a case where a current-voltage operation point after the arc is detected is continued for a predetermined period of time, the arc detector trips a switch which is provided at the own string.

5. The DC power generation system as in claim 4, further comprising an arc occurrence point specifying device which receives a judgement result whether an arc occurs outside the own string or not from each arc detector which is provided at the each string, wherein in a case where the arc occurrence point specifying device receives judgement results such that an arc occurs outside the own string respectively from all arc detectors, the arc occurrence point specifying device outputs a command to the each arc detector or the each switch to trip the each switch which is provided at the each string.

6. The DC power generation system as in claim 1, wherein the arc detector is configured to receive signals from each voltage-current sensor which is provided at the each string respectively,
in a case where an arc is detected in the arc noise analysis unit, the voltage-current variation analysis unit analyzes a voltage-current operation point of the each string based on a signal from the each voltage-current sensor and specifies the arc occurrence point based on variation of a voltage-current operation point of the each string before and after the arc is detected, and
the switch control unit controls to open or close of the switch based on arc specified result in the voltage-current variation analysis unit.

7. The DC power generation system as in claim 1, in which the voltage-current variation analysis unit judges whether an arc which occurs is a series arc or a parallel arc based on variation of voltage-current operation point before and after when the arc is detected.

8. The DC power generation system as in claim 1, wherein the each string comprises a backflow prevention diode.

9. A protection method for a DC power generation system which comprises a plurality of strings and each of the strings comprises a plurality of DC power generation modules connected in series, the each string is connected to a DC bus in parallel via a switch, and power is supplied to the DC bus,
the protection method comprising;
an arc detection step for detecting an arc which occurs in the DC power generation system based on noise which occurs in the string,
an arc occurrence point specifying step for specifying an arc occurrence point in a case where the arc is detected, a voltage-current operation point of output of each string of the plurality of strings are analyzed and based on variation of the voltage-current operation point before and after when the arc is detected, and a switch control step for controlling of opening or closing the switch based on specified result of the arc occurrence point.

10. The protection method for a DC power generation system as in claim 9, wherein in the arc occurrence point specifying step, in a case where a voltage-current operation point after the arc is detected is an operation point which deviates from a voltage-current characteristic curve of normal operation, it is specified such that an arc occurs in the string, and in the switch control step, the switch of the string in which arc occurrence is specified is tripped.

11. The protection method for a DC power generation system as in claim 9, wherein in the arc occurrence point specifying step, in all strings, in a case where a voltage-current operation point after the arc is detected is on a voltage-current characteristic curve of normal operation, it is specified such that an arc occurs outside the all strings, and in the switch control step, the switches of the all strings are tripped.

12. The protection method for a DC power generation system as in claim 9, further comprising an arc mode judgement step for judging whether an arc which occurs is a series arc or a parallel arc based on variation of voltage-current operation point before and after when the arc is detected.

13. The protection method for a DC power generation system as in claim 9, wherein the each string comprises a backflow prevention diode.

* * * * *